United States Patent
Imagawa

(10) Patent No.: US 7,755,430 B2
(45) Date of Patent: Jul. 13, 2010

(54) SPLITTER CIRCUIT

(75) Inventor: Kazuyuki Imagawa, Kanagawa (JP)

(73) Assignee: NEC Electronics Corporation, Kawasaki, Kanagawa (JP)

( * ) Notice: Subject to any disclaimer, the term of this patent is extended or adjusted under 35 U.S.C. 154(b) by 0 days.

(21) Appl. No.: 12/382,806

(22) Filed: Mar. 24, 2009

(65) Prior Publication Data
US 2009/0243728 A1 Oct. 1, 2009

(30) Foreign Application Priority Data
Mar. 28, 2008 (JP) .............................. 2008-087242
Jan. 14, 2009 (JP) .............................. 2009-005664

(51) Int. Cl.
*H03F 3/68* (2006.01)
(52) U.S. Cl. ..................... 330/295; 330/124 R; 330/53; 330/302
(58) Field of Classification Search .................. 330/295, 330/124 R, 53, 302
See application file for complete search history.

(56) References Cited

U.S. PATENT DOCUMENTS 5,045,822 A    9/1991  Mohwinkel
5,111,157 A *  5/1992  Komiak ....................... 330/286
5,126,684 A *  6/1992  Solomon ....................... 330/10
5,396,194 A *  3/1995  Williamson et al. ......... 330/297
6,300,835 B1* 10/2001 Seely et al. .................. 330/277
6,577,198 B1   6/2003  Bayruns
2007/0085617 A1* 4/2007 Salerno ....................... 331/167

* cited by examiner

*Primary Examiner*—Patricia Nguyen
(74) *Attorney, Agent, or Firm*—McGinn IP Law Group, PLLC

(57) ABSTRACT

A splitter circuit improves isolation between output ports. The splitter circuit comprises input port 1, output port 2, output port 3, FET 6, FET 11 and an impedance circuit. FET 6 is provided between input port 1 and output port 2 and adapted to amplify a signal at input port 1 to output an amplified signal to output port 2. FET 11 is provided between the input port 1 and the output port 3 and adapted to amplify a signal at input port 1 to output an amplified signal to the output port 3. The impedance circuit couples the output ports 2 and 3, and includes a first series circuit including inductor 15 and diode 17, series connected to each other, a second series circuit including inductor 16 and diode 18, series connected to each other, and resistor 19. The first series circuit has one end connected to output port 2 and the second series circuit has one end connected to output port 3. The resistor is connected between the other ends of the first and second series circuits and the ground. Diodes 17, 18 are connected so that current will flow in forward direction when voltage of a power supply is applied to FETs 6 and 11 (FIG. 1).

11 Claims, 10 Drawing Sheets

FIG. 10    COMPARATIVE
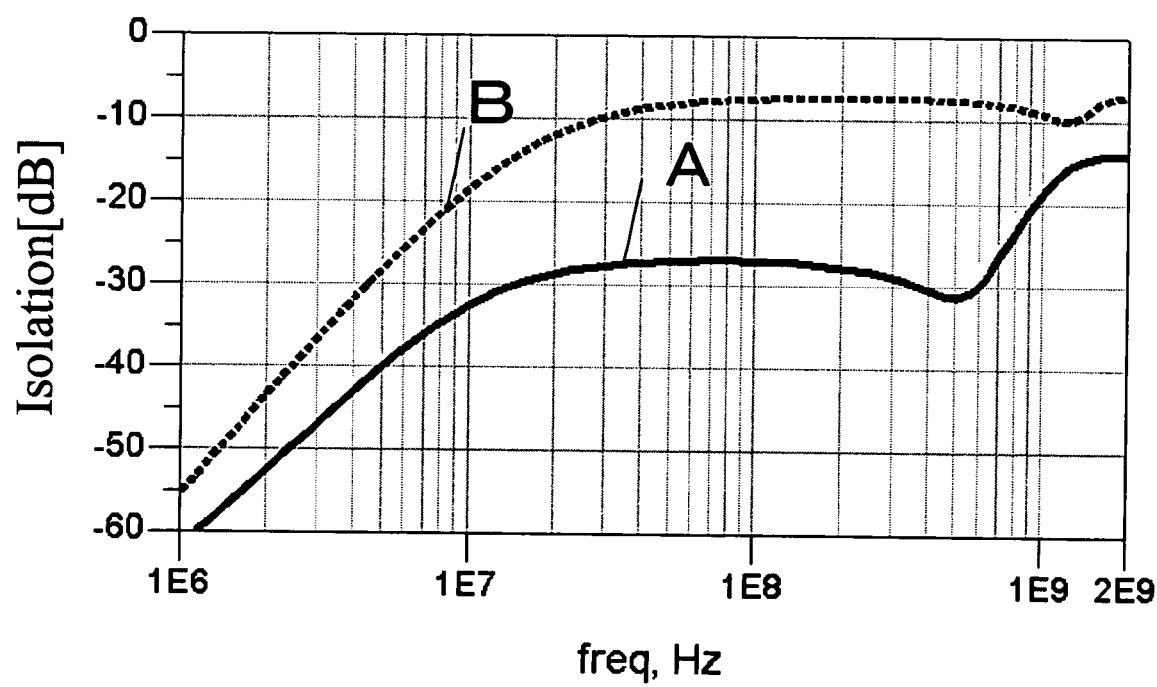

SPLITTER CIRCUIT

REFERENCE TO RELATED APPLICATION

This application is based upon and claims the benefit of the priorities of Japanese patent application No. 2008-087242, filed on Mar. 28, 2008 and Japanese patent application No. 2009-005664, filed on Jan. 14, 2009 the disclosures of which are incorporated herein in their entirety by reference thereto.

TECHNICAL FIELD

This invention relates to a splitter circuit and, more particularly, to a splitter circuit including an active device.

BACKGROUND

A splitter circuit is widely used, such as in an STB (set-top box)/TV for CATV/digital TV. A splitter circuit including an active device, such as FET, that is, active splitter circuit, is used in case a gain is needed. Among the important properties of the splitter circuit is isolation among its multiple output ports. Since a feedback circuit from an output to an input is usually provided to increase the frequency bandwidth, sufficient performance cannot be achieved by simply improving the isolation of the FET as the active device. It is necessary to improve the isolation in a peripheral circuit of the FET.

FIG. 9 depicts a circuit diagram of a splitter circuit disclosed in Patent Document 1. An input terminal 116 is grounded via a capacitive device C, while being connected to the gates of FETs Q1, Q2 via an inductor L1. The FET Q1 has a source grounded, and has a drain connected to an output port 118. A feedback circuit (impedance) 121, made up of an inductor L2 and a resistor R1, is connected between the drain and the gate of the FET Q1. The FET Q2 has a source grounded and has a drain connected to an output port 120. A feedback circuit (impedance) 123, made up of an inductor L3 and a resistor R2, is connected between the drain and the gate of the FET Q2. To improve the isolation between the output ports 118 and 120, a (interport impedance) circuit 114, made up of a resistor R3 and an inductor L4, is connected between the output ports 118 and 120.

With the above-described splitter circuit, when the FETs Q1 and Q2 are in operation, an RF signal, fed from the output port 118, is branched into a signal passing through the circuit 114 and a signal passing through the feedback circuit 121 of the FET Q1 or through the FET Q1. The signal that has passed through the circuit 121 or through the FET Q1 further passes through signal paths 110, 112 and is delivered to the FET Q2 where it is amplified. At this time, the signal undergoes phase shifting by 180 degrees and is delivered as an output to the output port 120. On the other hand, the signal that has passed through the circuit 114 gets to the output port 120 without undergoing phase shifting. Hence, the signal that has its phase shifted and the signal that has its phase not shifted will cancel each other, at the output port 120, with a result that the signal at the output port 120 is attenuated, thus improving the isolation.

Patent Document 2 also discloses a circuit that operates in a similar manner.

[Patent Document 1]
 U.S. Pat. No. 5,045,822
[Patent Document 2]
 U.S. Pat. No. 6,577,198

SUMMARY

The following analysis is given from the view of the present invention.

With the circuit of FIG. 9, the isolation is improved when the FETs Q1 and Q2 are in on-states. However, when the FETs Q1 and Q2 are in off-states, the FETs Q1 and Q2 are open-circuited with respect to the RF signal. The signal fed from the output port 118 is delivered via the circuit 114 to the output port 120 to deteriorate the isolation. Thus, when the power supply of the splitter circuit is off, the circuits or the devices, connected to the output ports 118, 120, are affected in operation.

FIG. 10 depicts isolation characteristics in conventional circuits as a comparative. In FIG. 10, curves A and B show characteristics for the case the FETs Q1 and Q2 are in operation and for the case the FETs are out of operation, respectively. When the FETs are off, the isolation is deteriorated, as indicated by a curve B of FIG. 10. Thus there is much to be desired in the art.

In one aspect, there is provided a splitter circuit comprising an input terminal, a first output terminal, a second output terminal, a first amplifier, a second amplifier and an impedance circuit. The first amplifier is arranged between the input terminal and the first output terminal to amplify a signal at the input terminal to output an amplified signal to the first output terminal, and the second amplifier is arranged between the input terminal and the second output terminal to amplify a signal at the input terminal to output an amplified signal to the second output terminal. The impedance circuit is connected between the first and second output terminals. The impedance circuit provides a preset impedance in case a first power supply is fed to the first and second amplifiers, and is open-circuited in case the first power supply is not fed to the first nor to the second amplifier.

In a second aspect, there is provided a splitter circuit comprising an input terminal, an i'th output terminal, where i denotes an integer from 1 to n, n being an integer not less than 2, an i'th amplifier and an impedance circuit. The i'th amplifier is arranged between the input terminal and the i'th output terminal, and adapted for amplifying a signal at the input terminal and outputting an amplified signal to the i'th output terminal. The impedance circuit is connected between a j'th output terminal and a k'th output terminal, where j is an integer from 1 to n−1 and k is an integer from j+1 to n. The impedance circuit operates as a preset impedance in case a first power supply is fed to a j'th amplifier and to a k'th amplifier. The impedance circuit is open-circuited in case the first power supply is not fed to the j'th amplifier nor to the k'th amplifier.

In a third aspect, there is provided a splitter circuit comprising an input terminal, an i'th output terminal, where i denotes an integer from 1 to n, n being an integer not less than 2, an i'th amplifier and one or more impedance circuit. The i'th amplifier is provided between the input terminal and the i'th output terminal and adapted to amplify a signal at the input terminal to deliver an amplified signal to the i'th output terminal. The impedance circuit(s) is connected to at least two out of the first to n'th output terminals. The impedance circuit operates so that, when a first power supply is fed to amplifiers associated with at least two output terminals, a signal path between two of the output terminals selected out of the at least two output terminals will present a preset impedance. The impedance circuit also operates so that, when the first power supply is not fed, the signal path between the selected two output terminals will be open-circuited.

The meritorious effects of the present invention are summarized as follows, however, not limited thereto.

According to the present invention, it is possible to improve the isolation across the first and second output terminals without dependency on whether or not the power is being fed from the power supply to the amplifiers.

BRIEF DESCRIPTION OF THE DRAWINGS

FIG. 10 is a graph showing isolation characteristics of a conventional splitter circuit.

PREFERRED MODES

Figure 1:
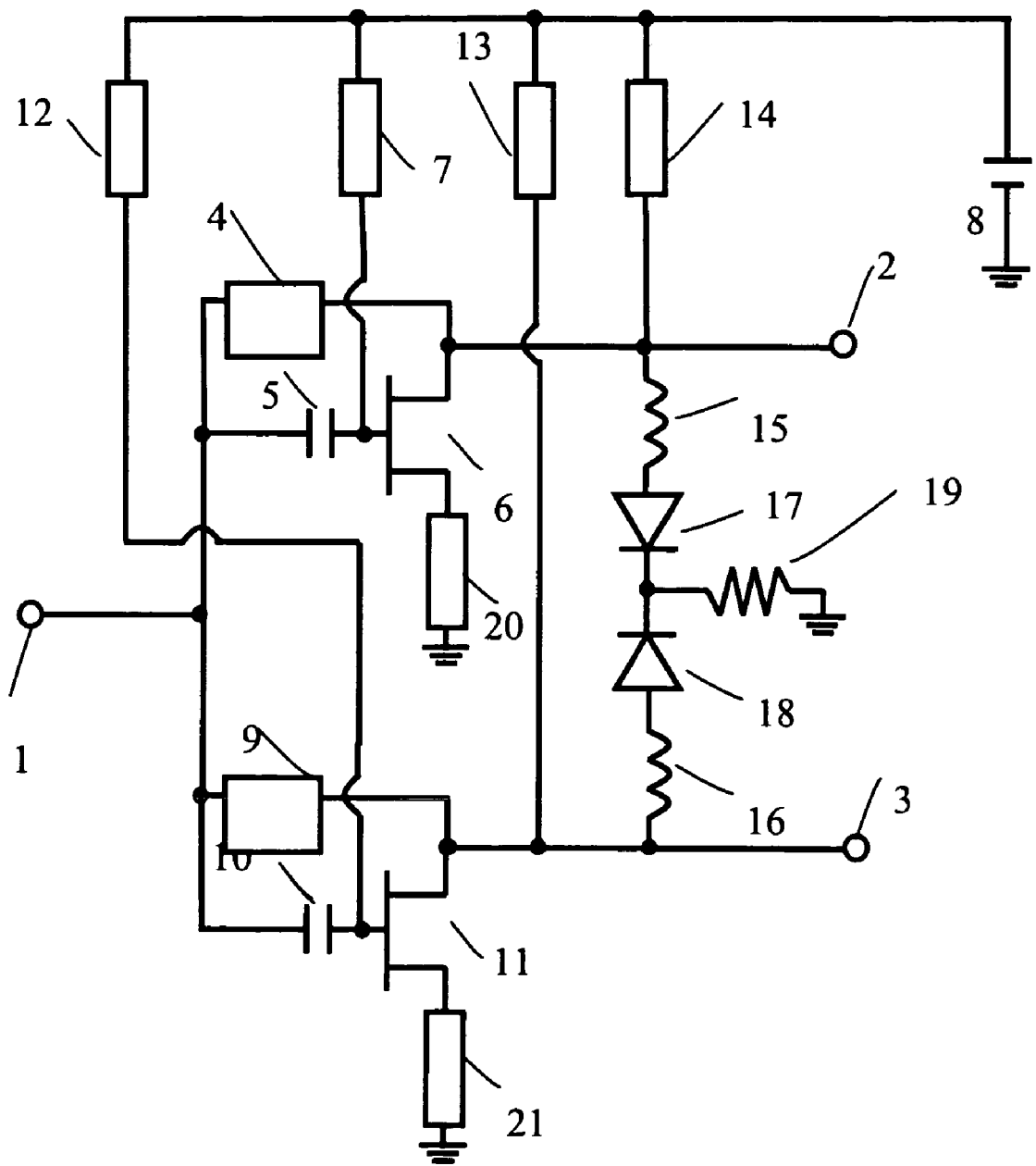
FIG. 1 is a circuit diagram of a splitter circuit of an Exemplary Embodiment 1 of the present invention.

A splitter circuit according to a preferred mode of the present invention includes an input terminal (input port), a first output terminal (output port), a second output terminal, a first amplifier, a second amplifier and an impedance circuit. The first amplifier is arranged between the input terminal and the first output terminal to amplify a signal at the input terminal to output an amplified signal to the first output terminal. The second amplifier is arranged between the input terminal and the second output terminal to amplify a signal at the input terminal to output an amplified signal to the second output terminal. The impedance circuit is connected between the first and second output terminals. The impedance circuit provides a preset impedance in case a voltage of a first power supply is fed to the first and second amplifiers. The impedance circuit is open-circuited in case the voltage of the first power supply is not fed to the first amplifier nor to the second amplifier.

In the splitter circuit of a preferred mode, the impedance circuit includes a first series circuit of a first inductor and a first diode, having one end connected to the first output terminal, a second series circuit of a second inductor and a second diode, having one end connected to the second output terminal, and a resistor connected between the other ends of the first and second series circuits and a second power supply. Preferably, the first and second diodes are connected so that current will flow therethrough in a forward direction in case a voltage of the first power supply and a voltage of the second power supply differ from each other.

In a splitter circuit of a preferred mode, the voltage of the first power supply may be set so as to be higher than that of the second power supply. The first diode may have an anode connected via the first inductor to the first output terminal and may have a cathode connected to one end of the resistor, while the second diode may have an anode connected via the second inductor to the second output terminal and has a cathode connected to the one end of the resistor. The other end of the resistor may be connected to the second power supply.

A semiconductor device according to the present invention preferably includes the splitter circuit described above.

A splitter apparatus according to the present invention may include a semiconductor device which in turn includes any one of the above mentioned splitter circuits less the resistor. This resistor may be provided outside the semiconductor device and connected to the semiconductor device via a bonding wire.

In the above-described splitter circuit, in case a voltage of the first power supply is fed to the first and second amplifiers, a signal without phase shift and a signal with a 180 degrees phase shift cancel each other at the output terminal. In case the voltage from the first power supply is not fed to the first amplifier nor to the second amplifier, a current path across the output terminals is broken at the open-circuited impedance circuit. It is thus possible to maintain the isolation across the output terminals without dependency on whether or not the voltage is fed from the first power supply.

The present invention is now described in detail with reference to Exemplary Embodiments shown in the drawings.

Exemplary Embodiment 1

FIG. 1 depicts a circuit diagram of a splitter circuit according to an Exemplary Embodiment 1 of the present invention. In FIG. 1, 1 denotes an input port, and 2, 3 denote output ports. To the input port 1 are connected the gates of FETs 6, 11 via capacitive devices 5, 10, respectively. The FETs are used for amplification, while the capacitive devices are used for DC cutting. The sources of the FETs 6, 11 are respectively grounded via source circuits 20, 21. The drains of the FETs 6, 11 are respectively connected via feedback circuits 4, 9 to the input port 1, while also being respectively connected to the output ports 2, 3. To feed a DC voltage, the gates of the FETs 6, 11 are connected via gate bias circuits 7, 12 to a power supply 8. The drains of the FETs are also respectively connected via drain bias circuits 13, 14 to the power supply 8. The gate bias circuits 7, 12 and the drain bias circuits 13, 14 are formed by devices not allowing for passage therethrough of the RF signal, such as inductors or resistors, which may be used either alone or in combination.

Anodes of diodes 17, 18 are respectively connected to the output ports 2, 3 via inductors 15, 16. Cathodes of the diodes 17, 18 are connected in common and grounded via a resistor 19. The resistance value of the resistor 19 is set so as to be large enough as compared to the on-resistance of the diodes 17, 18. On the other hand, the resistance value of the resistor 19 is optimized so that, in case the FETs 6, 11 are in the operating state, that is, in case a voltage of, for example, 5V, is fed from the power supply 8, such a voltage that causes the diodes 17 and 18 to be turned on will be applied across the anode and the cathode of each of the diodes.

Referring to FIG. 1, when the FETs 6, 11 are in operating states, that is, when the voltage of, for example, 5V, is fed from the power supply 8, the following operation will take place. The diodes 17, 18 are in on-states at this time because of the optimized resistor 19.

An RF signal, fed from the output port 2, is branched into a signal that passes through the feedback circuit 4 or the FET 6 and a signal that passes through the inductor 15. The signal that passes through the feedback circuit 4 or the FET 6 enters the gate of the FET 11 and is amplified so as to be delivered to the output port 3. The signal at this time undergoes phase shifting through 180 degrees. On the other hand, if the inductance values of the inductors 15, 16 are low and the resistance value of the resistor 19 is sufficiently higher than the on-resistances of the diodes 17, 18, the signal passing through the inductor 15 will pass through the diodes 17, 18 and the inductor 16 so as to be output at the output port 3 without undergoing phase shifting. Thus, by optimizing the on-resistances of the diodes 17, 18, the signal phase-shifted by 180 degrees and the non-phase-shifted signal cancel each other at the output port 3 to attenuate the signal from the output port 2, thus improving the isolation across the output ports 2 and 3. In case the phase difference of the two signals to be canceled is not 180 degrees due to certain wiring or FET characteristics, the inductance values of the inductors 15, 16 are adjusted so that the phase difference will be 180 degrees to allow for cancelation of the two signals. The same applies for the RF signal fed from the output port 3. That is, this RF signal is canceled in similar manner at the output port 2.

If, in FIG. 1, the FETs 6, 11 are in off-states, that is, the power supply 8 is 0V, for example, the following operation will take place. The diodes 17, 18 are in off-states at this time because no voltage is applied across their anodes and cathodes.

Since the FET 6 and the diode 17 are both off, the major portion of the RF signal, fed from the input port 2, is output at the output port 3 via the feedback circuits 4, 9. Since in general the feedback circuits 4, 9 are of high resistance values, the signal at the output port 3 is small, such that the isolation is not deteriorated. The same may be said of the RF signal fed from the output port 3. That is, the signal at the output port 2 is small, such that the isolation is not deteriorated.

Figure 2:
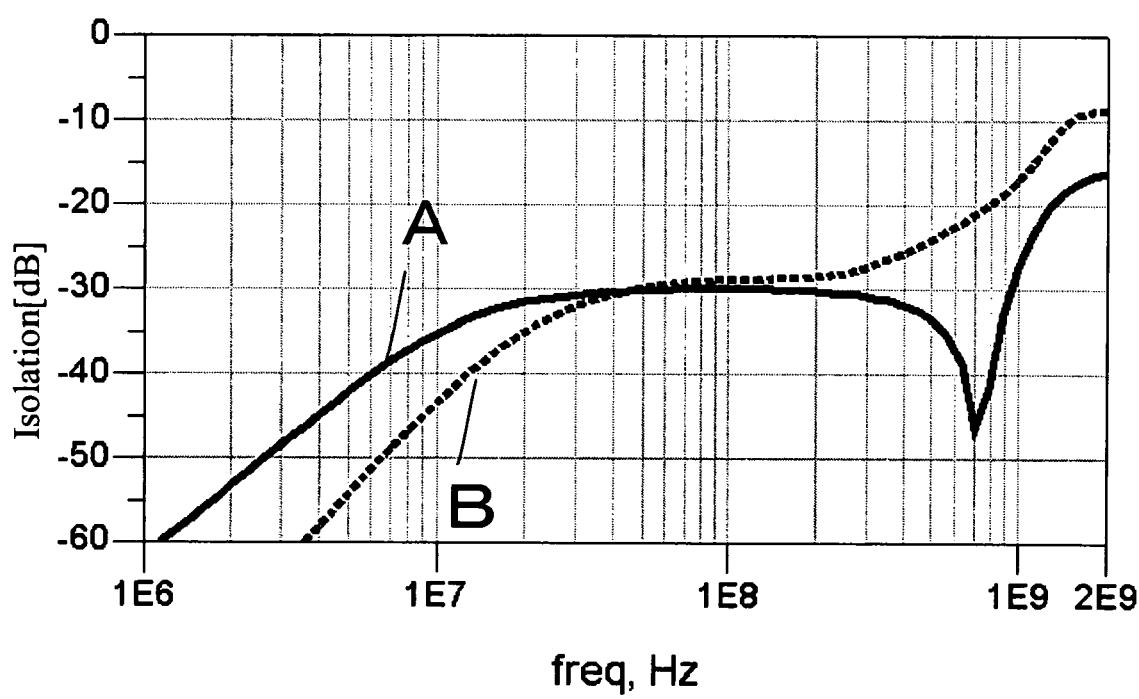
FIG. 2 is a graph showing isolation characteristics of the splitter circuit of the Exemplary Embodiment 1 of the present invention.

FIG. 2 depicts a graph showing isolation characteristics in a splitter circuit of Exemplary Embodiment 1. In this graph, a curve A stands for a characteristic for the FETs being in operating states, while a curve B stands for a characteristic for the FETs being in off-states. It is thus seen from FIG. 2 that a high isolation characteristic is maintained irrespective of on/off states of the FETs. That is, in the present Exemplary Embodiment, in which the resistor R3, coupled between the output ports of the conventional splitter circuit, is replaced by the diodes 17, 18 that are turned off when the FETs are turned off, the isolation characteristic for the FET-off time may be improved appreciably (see a curve B of FIG. 2 in comparison with a curve B of FIG. 10).

Exemplary Embodiment 2

Figure 3:
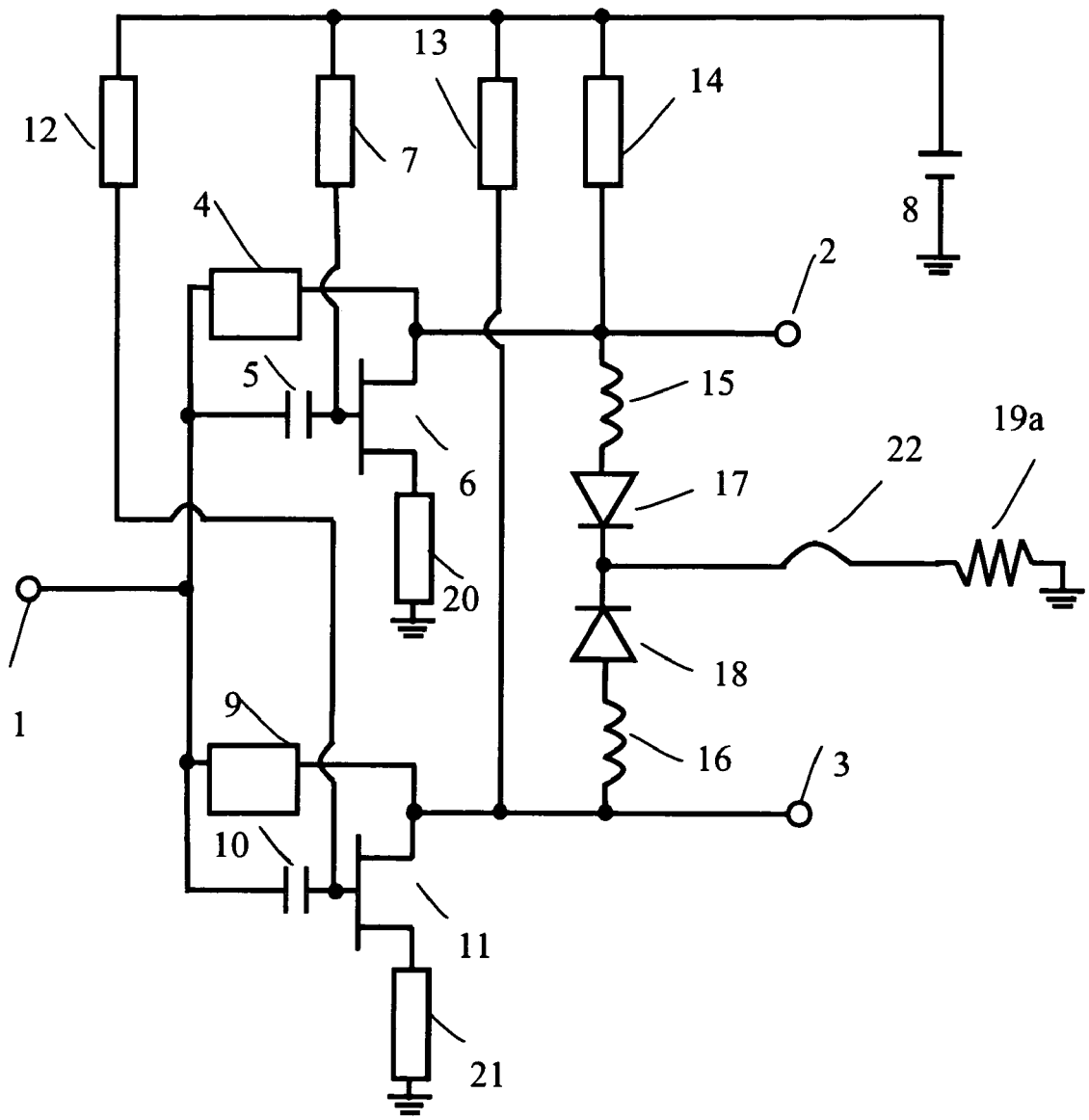
FIG. 3 is a circuit diagram of a splitter circuit of an Exemplary Embodiment 2 of the present invention.

FIG. 3 shows a circuit diagram of a splitter circuit of Exemplary Embodiment 2. In FIG. 3, the same reference numerals or symbols are used to depict the same parts, and the corresponding description is dispensed with. A resistor 19a of FIG. 3 is similar to the resistor 19 of FIG. 1. However, in distinction from the case of the Exemplary Embodiment 1, the resistor 19a of FIG. 3 is constructed as a component that is external of an IC. A bonding wire(s) 22 couples the IC and the resistor 19a which is an external component. Specifically, the bonding wire(s) couples the cathodes of the diodes 17, 18 and one end of the resistor 19a. The operation of the splitter circuit of the Exemplary Embodiment 2 is similar to that of Exemplary Embodiment 1 and may yield a similar favorable effect.

In the present Exemplary Embodiment, the resistor 19a is the external component. Hence, the resistance value of the resistor 19a for changing the isolation characteristic across the output ports 2 and 3 may be externally adjusted with more ease. Moreover, the temperature characteristic in the isolation characteristic across the output ports 2 and 3 may be improved by using a component having a proper temperature characteristic as the resistor 19a.

Exemplary Embodiment 3

Figure 4:
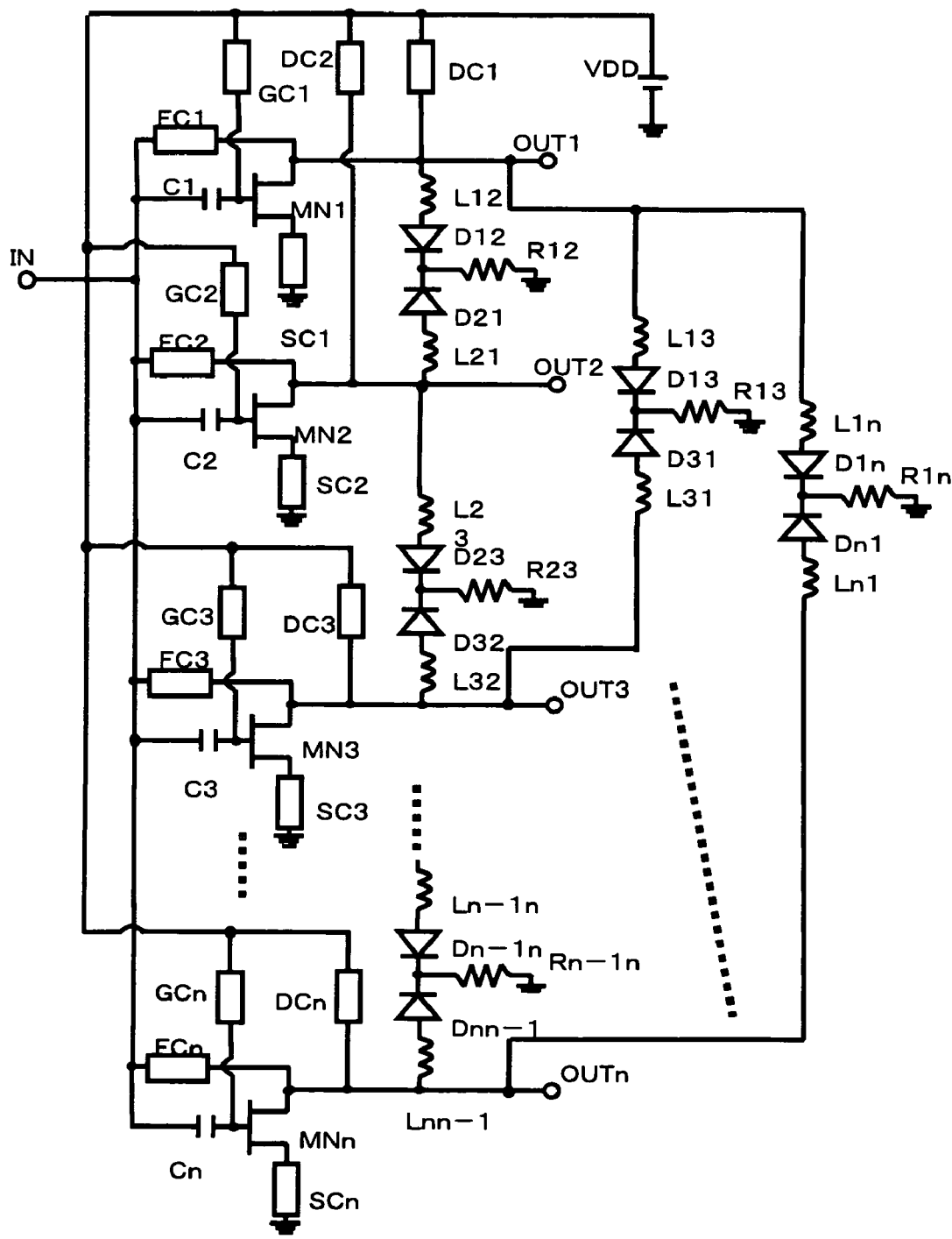
FIG. 4 is a circuit diagram of a splitter circuit of an Exemplary Embodiment 3 of the present invention.

FIG. 4 depicts a circuit diagram of a splitter circuit of an Exemplary Embodiment 3. An input port IN, output ports OUT1 to OUTn, capacitive devices C1 to Cn, FETs MN1 to MNn, source circuits SC1 to SCn, feedback circuits FC1 to FCn, gate bias circuits GC1 to GCn, drain bias circuits DC1 to DCn, a power supply VDD, diodes D12 to Dnn−1, inductors L12 to Lnn−1 and resistors R12 to Rn−1n of FIG. 4 correspond respectively to and operate in the same way as the input port 1, output ports 2, 3, capacitive devices 5, 10, FETs 6, 11, source circuits 20, 21 feedback circuits 4, 9, gate bias circuits 7, 12, drain bias circuits 13, 14, power supply 8, diodes 17, 18, inductors 15, 16 and the resistor 19 of FIG. 1.

The splitter circuit of FIG. 1 includes two amplifying sections having the common input terminal. In contrast, the splitter circuit of FIG. 4 includes an n-number amplifier sections having the input terminal in common. An impedance circuit is arranged across the output terminals of two selected ones of the amplifying sections. In each of these impedance circuits, a signal phase-shifted by 180 degrees and a non-phase-shifted signal cancel each other at the output port, when the FETs in the amplifying sections are in the operating states, as in the Exemplary Embodiment 1. Hence, the signal from one of the output portpair is attenuated, thus improving the isolation across the output terminals of the two amplifying sections concerned. On the other hand, if the FETs in the two amplifying sections are in the off-states, the impedance circuit concerned is in the high-impedance state, with the result that the isolation across the output terminals of the two amplifying sections concerned is not deteriorated.

Figure 5:
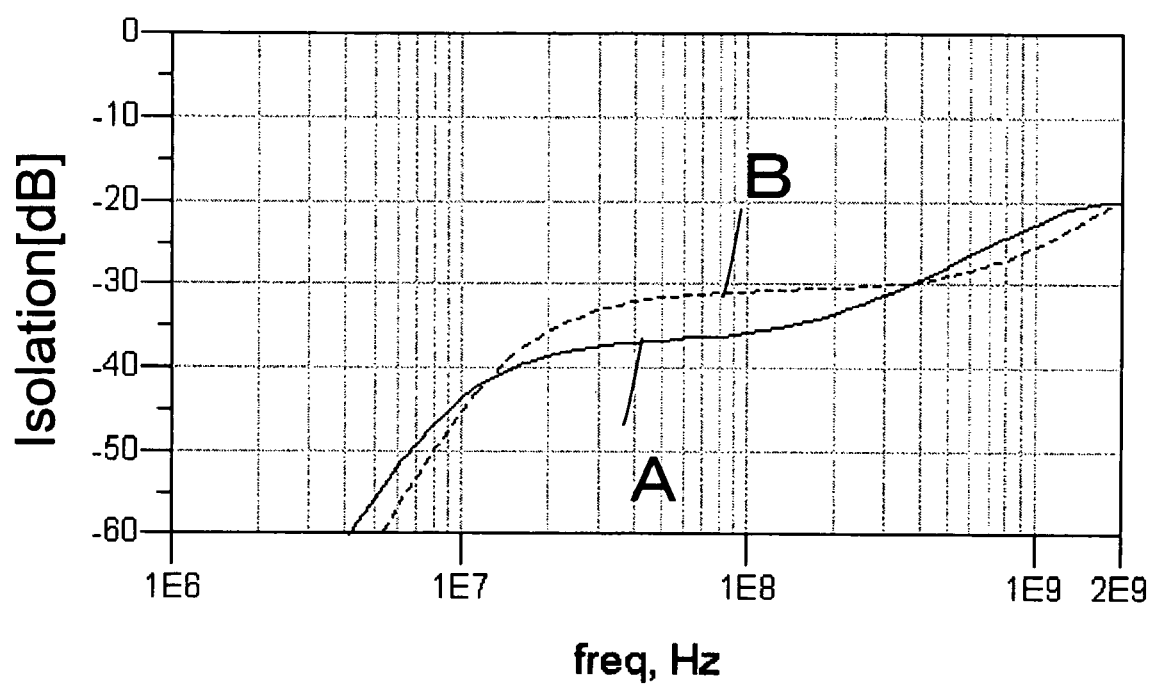
FIG. 5 is a graph showing isolation characteristics of the splitter circuit of the Exemplary Embodiment 3 of the present invention.

FIG. 5 depicts a graph showing isolation characteristics in the splitter circuit of Exemplary Embodiment 3. In this graph, curve A stands for a characteristic for the FET being in an operating state, and curve B for the FET being in an off-state. FIG. 5 indicates that a high isolation characteristic is maintained irrespective of on/off states of the FETs.

With the splitter circuit of the Exemplary Embodiment 3, the isolation across the output terminals may be maintained, as in the Exemplary Embodiment 1, even with a circuit formulation with three or more branch segments. The resistors R12 to Rn−1n may be external components, which may be connected to an IC using bonding wires, as in the Exemplary Embodiment 2. It is noted that the formulation of Exemplary Embodiment 3 is coincident with the Exemplary Embodiment 1 if n=2.

Exemplary Embodiment 4

Figure 6:
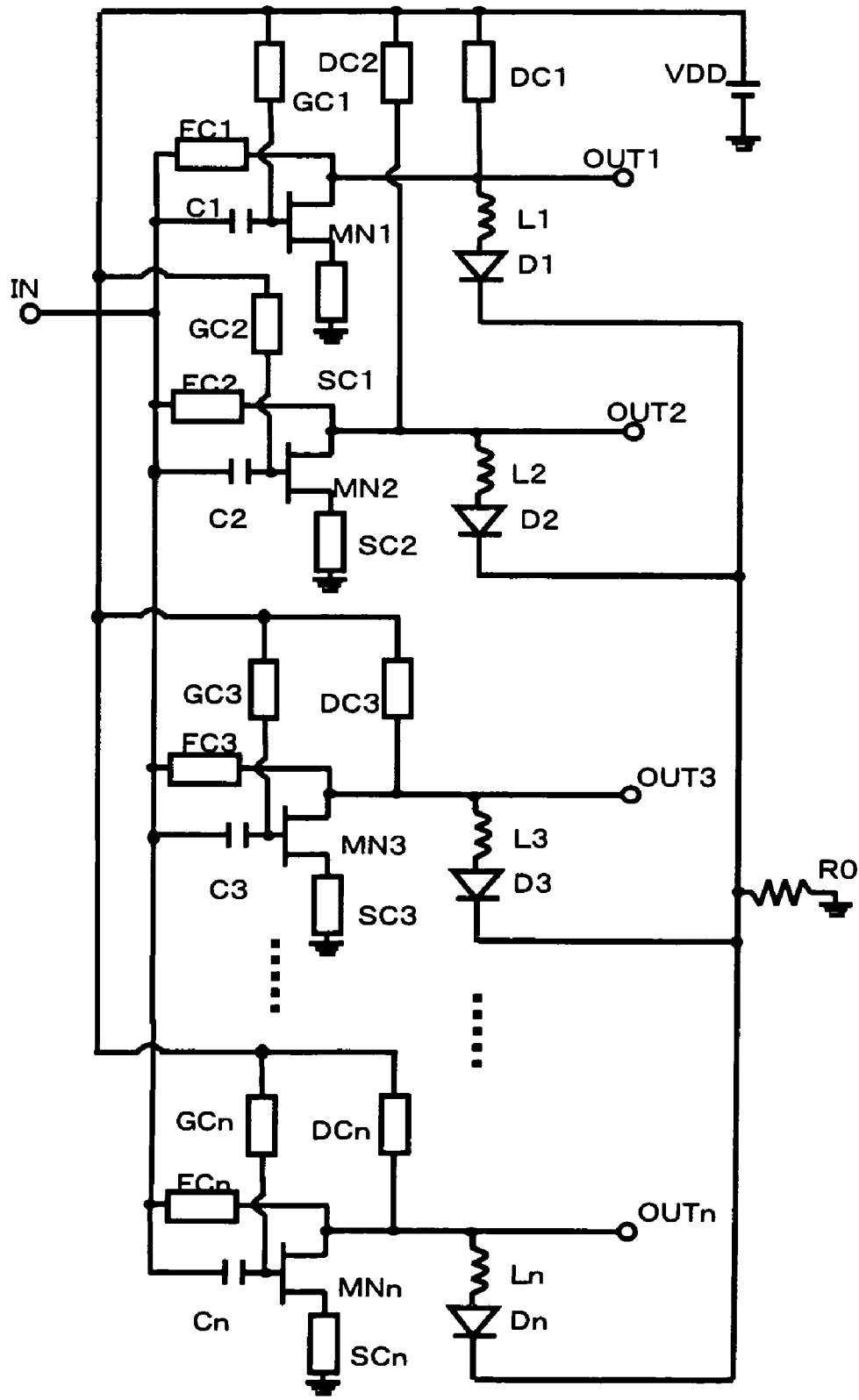
FIG. 6 is a circuit diagram of a splitter circuit of an Exemplary Embodiment 4 of the present invention.

FIG. 6 shows a circuit diagram of a splitter circuit of Exemplary Embodiment 4. In FIG. 6, the same reference numerals or symbols are used to depict the same parts, and the corresponding description is dispensed with. The splitter circuit, shown in FIG. 6, includes diodes D1 to Dn, inductors L1 to Ln and a resistor R0, in place of the diodes D12 to Dnn−1, inductors L12 to Lnn−1 and the resistors R12 to Rn−1n of FIG. 4, respectively.

A series circuit, composed of the inductor Li and the diode Di, is connected between an output port OUTi and one end of the resistor R0. This resistor R0 has its one end connected in common to the cathodes of the diodes D1 to Dn, while having its other end grounded.

With the above-described formulation of the splitter circuit, n-number of amplifying sections, having a common input terminal IN, are provided, and a part (series set of diode and inductor) of an impedance circuit is provided in association with each of the output terminals of the n-number of the amplifying sections making up an impedance circuit between any two amplifying sections. As in the Exemplary Embodiment 1, when FETs in the amplifying sections are in the operating state, a signal phase-shifted by 180 degrees and a non-phase-shifted signal cancel each other at any one of the output ports, with the result that the signal fed from any other of the output ports is attenuated, thus improving the isolation across the output terminals of two amplifying sections. On the other hand, when the FET in each amplifying section is in a cut-off state, the impedance circuit is in a state of high impedance, with the result that the isolation across the output terminals of the two amplifying sections is not deteriorated.

Figure 7:
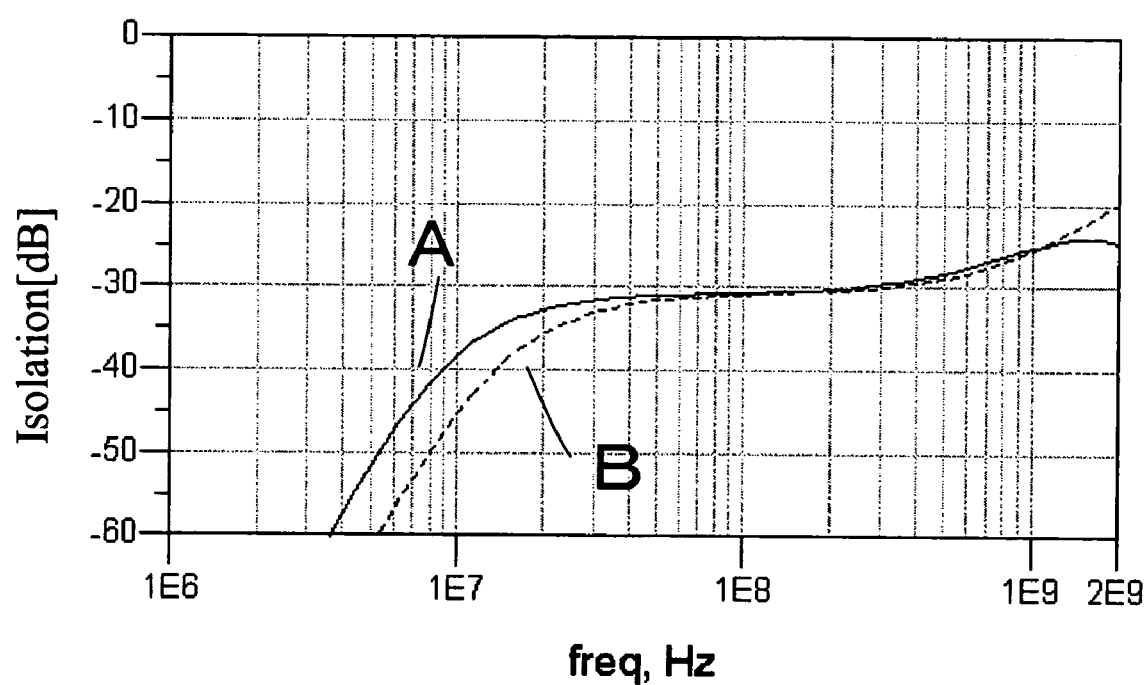
FIG. 7 is a graph showing isolation characteristics of the splitter circuit of the Exemplary Embodiment 4 of the present invention.

FIG. 7 depicts a graph showing isolation characteristics in a splitter circuit of Exemplary Embodiment 4. In this graph, curve A stands for a characteristic for the FETs being in operating states, and curve B for the FETs being in off-states. It may be seen from FIG. 7 that a high isolation characteristic is maintained without dependency upon the on/off states of the FETs.

With the splitter circuit of the Exemplary Embodiment 4, the isolation across the output terminals may be maintained, as in the Exemplary Embodiment 1, even with the formulation with three or more branch segments. The resistor R0 may be an external component, which may be connected to an IC using a bonding wire, as in the Exemplary Embodiment 2. It is noted that the formulation of Exemplary Embodiment 4 is coincident with the Exemplary Embodiment 1 if n=2.

Figure 8:
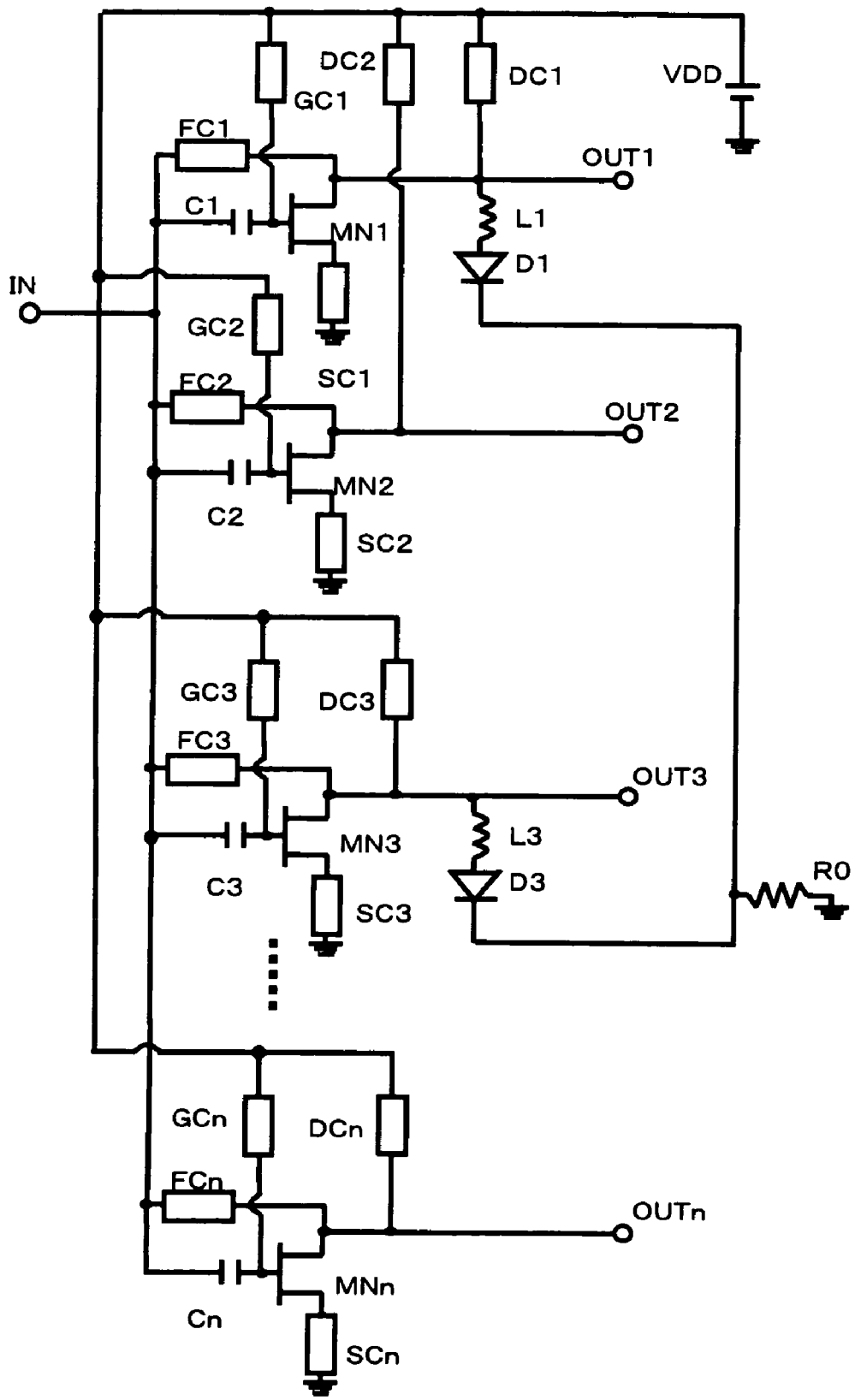
FIG. 8 is a circuit diagram of a splitter circuit of an Exemplary Embodiment 5 of the present invention.
Figure 9:
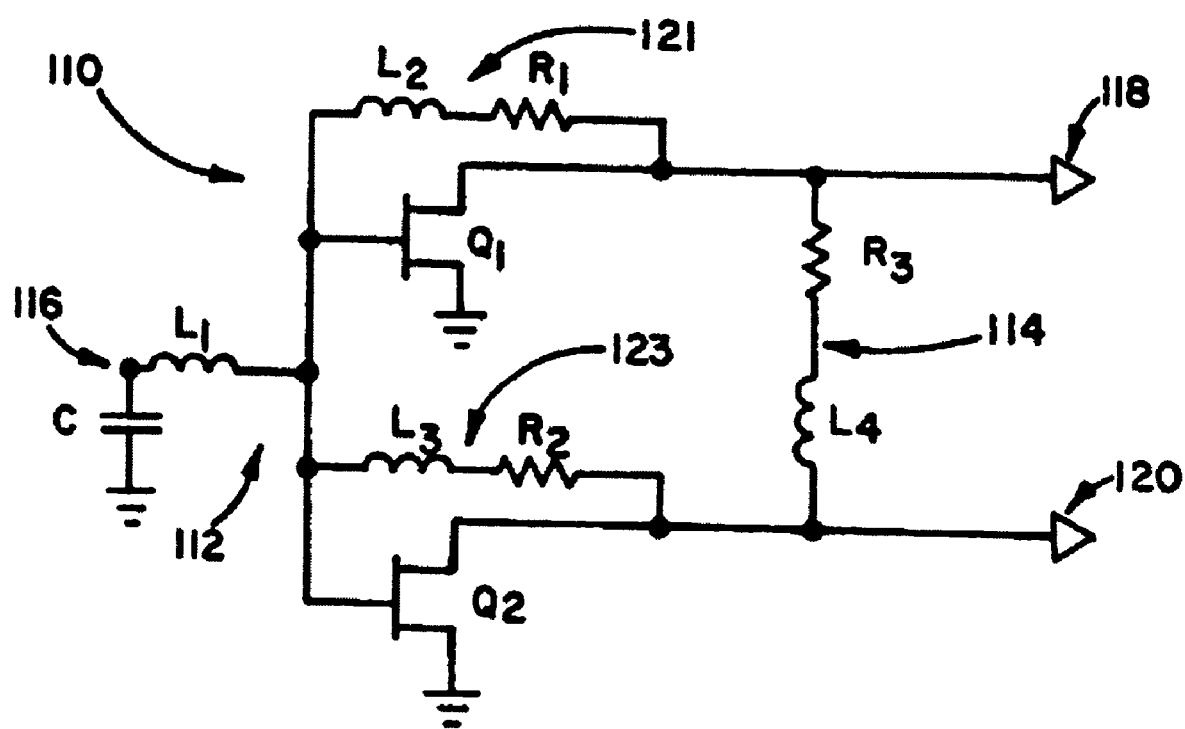
FIG. 9 is a circuit diagram of a conventional splitter circuit.

FIG. 8 shows a circuit diagram of a splitter circuit of an Exemplary Embodiment 5. In FIG. 8, the same reference numerals or symbols are used to depict the same parts, and the corresponding description is dispensed with. With the splitter circuit of FIG. 8, the diodes D2, D4 to Dn as well as the inductors L2, L4 to Ln are dispensed with. The present splitter circuit, shown in FIG. 8, has the same formulation as the circuit of Exemplary Embodiment 1 as regards the output ports OUT1 and OUT3.

In case no high isolation characteristic is needed across all of the output ports, such that only the isolation between the output ports OUT1 and OUT3, for example, is needed, the inductors L1, L3 and the diodes D1, D3 are provided only in connection with the output ports OUT1 and OUT3. With this formulation, the circuit formulation may be simplified as compared to the Exemplary Embodiments 3 and 4.

The disclosures of the aforementioned Patent Documents are incorporated by reference herein. The particular exemplary embodiments or examples may be modified or adjusted within the gamut of the entire disclosure of the present invention, inclusive of claims, based on the fundamental technical concept of the invention. Further, variegated combinations or selections of the elements disclosed herein may be made within the framework of the claims. That is, the present invention may encompass various modifications or corrections that may occur to those skilled in the art within the gamut of the entire disclosure of the present invention, inclusive of claims, and the technical concept of the invention.

It should be noted that other objects, features and aspects of the present invention will become apparent in the entire disclosure and that modifications may be done without departing the gist and scope of the present invention as disclosed herein and claimed as appended herewith.

Also it should be noted that any combination of the disclosed and/or claimed elements, matters and/or items may fall under the modifications aforementioned.

What is claimed is:

1. A splitter circuit comprising:
an input terminal;
a first output terminal;
a second output terminal;
a first amplifier arranged between said input terminal and said first output terminal to amplify a signal at said input terminal to output an amplified signal to said first output terminal;
a second amplifier arranged between said input terminal and said second output terminal to amplify a signal at said input terminal to output an amplified signal to said second output terminal; and
an impedance circuit connected between said first and second output terminals;
said impedance circuit providing a preset impedance in case a first power supply is fed to said first and second amplifiers; said impedance circuit being open-circuited in case said first power supply is not fed to said first nor to said second amplifier.

2. The splitter circuit according to claim 1, wherein said impedance circuit comprises:
a first series circuit including a first inductor and a first diode series connected to each other; said first series circuit having one end connected to said first output terminal;
a second series circuit including a second inductor and a second diode series connected to each other; said second series circuit having one end connected to said second output terminal; and
a resistor connected between the other ends of said first and second series circuits and a second power supply;
said first and second diodes being connected so that current will flow therethrough in a forward direction in case a voltage of said first power supply and a voltage of said second power supply differ from each other.

3. The splitter circuit according to claim 2, wherein the voltage of said first power supply is set so as to be higher than that of said second power supply;
said first diode has an anode connected via said first inductor to said first output terminal and has a cathode connected to one end of said resistor;
said second diode has an anode connected via said second inductor to said second output terminal and has a cathode connected to one end of said resistor; and wherein
the other end of said resistor is connected to said second power supply.

4. A splitter circuit comprising:
an input terminal;
an i'th output terminal, where i denotes an integer from 1 to n, n being an integer not less than 2;
an i'th amplifier arranged between said input terminal and said i'th output terminal, and adapted for amplifying a signal at said input terminal and outputting an amplified signal to said i'th output terminal; and
an impedance circuit connected between a j'th output terminal and a k'th output terminal, where j is an integer from 1 to n−1 and k is an integer from j+1 to n;
said impedance circuit operating as a preset impedance in case a first power supply is fed to a j'th amplifier and to a k'th amplifier; said impedance circuit being open-circuited in case said first power supply is not fed to said j'th amplifier nor to said k'th amplifier.

5. The splitter circuit according to claim 4, wherein said impedance circuit comprises:
- a j'th series circuit including a j'th inductor and a j'th diode series connected to each other; said j'th series circuit having one end connected to said j'th output terminal;
- a k'th series circuit including a k'th inductor and a k'th diode series connected to each other; said k'th series circuit having one end connected to said k'th output terminal; and
- a resistor connected between opposite ends of said j'th and k'th series circuits and a second power supply;
- said i'th and k'th diodes being connected to allow the current to flow therethrough in a forward direction in case a voltage of said first power supply and a voltage of said second power supply differ from each other.

6. The splitter circuit according to claim 5, wherein
- the voltage of said first power supply is set so as to be higher than the voltage of said second power supply;
- said j'th diode having an anode connected via said j'th inductor to said j'th output terminal and having a cathode connected to one end of said resistor;
- said k'th diode having an anode connected via said k'th inductor to said k'th output terminal and having a cathode connected to said one end of said resistor;
- the other end of said resistor being connected to said second power supply.

7. A splitter circuit comprising:
- an input terminal;
- an i'th output terminal, where i denotes an integer from 1 to n, n being an integer not less than 2;
- an i'th amplifier arranged between said input terminal and said i'th output terminal and adapted to amplify a signal at said input terminal to deliver an amplified signal to said i'th output terminal; and
- an impedance circuit(s) connected to at least two of said first to n'th output terminals;
- said impedance circuit(s) operating so that, when a first power supply is fed to amplifiers associated with said at least two output terminals, a signal path between two of said output terminals selected out of said at least two output terminals will present a preset impedance; said impedance circuit(s) also operating so that, when said first power supply is not fed, said signal path between said selected two output terminals is open-circuited.

8. The splitter circuit according to claim 7, wherein said impedance circuit(s) comprises:
- respective series circuits each including an inductor and a diode series connected to each other; each of said series circuits having one end connected to one of said at least two output terminals associated therewith; and
- a resistor connected between the other ends of said respective series circuits and said second power supply;
- said diode being connected to allow a current to flow therethrough in a forward direction in case a voltage of said first power supply and a voltage of said second power supply differ from each other.

9. The splitter circuit according to claim 8, wherein
- a voltage of said first power supply is set so as to be higher than a voltage of said second power supply;
- said diodes each having an anode connected via said inductor to any of said at least two output terminals and having cathodes each connected to one end of said resistor;
- an opposite end of said resistor being connected to said second power supply.

10. A semiconductor device comprising: the splitter circuit according to claim 1.

11. A splitter apparatus comprising:
- a semiconductor device; said semiconductor device including the splitter circuit according to claim 2 without said resistor;
- said resistor being arranged outside of said semiconductor device and connected to said semiconductor device via a bonding wire.

* * * * *